(12) United States Patent
Sevillano

(10) Patent No.: US 8,900,470 B2
(45) Date of Patent: Dec. 2, 2014

(54) DIFFERENTIAL MEASUREMENTS FOR ENDPOINT SIGNAL ENHANCEMENT

(71) Applicant: Lam Research Corporation, Fremont, CA (US)

(72) Inventor: Evelio Sevillano, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 16 days.

(21) Appl. No.: 13/654,310

(22) Filed: Oct. 17, 2012

(65) Prior Publication Data

US 2014/0106476 A1 Apr. 17, 2014

(51) Int. Cl.
*G01L 21/30* (2006.01)

(52) U.S. Cl.
USPC .. 216/60; 216/59; 216/66; 438/9; 156/345.24

(58) Field of Classification Search
USPC ............ 216/58, 59, 60, 67, 72; 438/5, 9, 706, 438/709, 714, 740; 156/345.24, 345.25, 156/345.26
See application file for complete search history.

(56) References Cited

U.S. PATENT DOCUMENTS

| | | | | |
|---|---|---|---|---|
| 5,450,205 | A * | 9/1995 | Sawin et al. | 356/632 |
| 6,677,604 | B2 * | 1/2004 | Mitrovic | 250/573 |
| 8,158,526 | B2 * | 4/2012 | Grimbergen | 438/714 |
| 2011/0174606 | A1 * | 7/2011 | Funk et al. | 204/164 |

* cited by examiner

*Primary Examiner* — Lan Vinh
(74) *Attorney, Agent, or Firm* — Beyer Law Group LLP

(57) ABSTRACT

A method for etching a layer is provided. A substrate is provided in a chamber. An etch plasma for etching a layer on the substrate is generated. Light from a first region of the chamber is measured to provide a first signal. Light from a second region of the chamber is measured to provide a second signal. The first signal with the second signal are compared to determine an etch endpoint.

20 Claims, 5 Drawing Sheets

US 8,900,470 B2

DIFFERENTIAL MEASUREMENTS FOR ENDPOINT SIGNAL ENHANCEMENT

BACKGROUND OF THE INVENTION

Field of the Invention

The invention relates to a method of forming semiconductor devices on a semiconductor wafer. More specifically, the invention relates to determining endpoints during semiconductor processing.

In forming semiconductor devices, endpoint detection is used to determine when a process should be stopped. Such endpoint detection may detect the presence of a species in a plasma. In certain processes detection of an endpoint species is difficult.

SUMMARY OF THE INVENTION

To achieve the foregoing and in accordance with the purpose of the present invention, a method for etching a layer is provided. A substrate is provided in a chamber. An etch plasma for etching a layer on the substrate is generated. Light from a first region of the chamber is measured to provide a first signal. Light from a second region of the chamber is measured to provide a second signal. The first signal with the second signal are compared to determine an etch endpoint.

In another manifestation of the invention, an apparatus for etching an etch layer is provided. A plasma processing chamber is provided. A chamber wall forms a plasma processing chamber enclosure. A substrate support for supporting a wafer is within the plasma processing chamber enclosure. A pressure regulator for regulating the pressure in the plasma processing chamber enclosure is in fluid communication with the plasma processing chamber. At least one electrode for providing power to the plasma processing chamber enclosure for sustaining a plasma is adjacent to the plasma processing chamber. A first light sensor is positioned to detect light from a first region of the plasma processing chamber. A second light sensor is positioned to detect light from a second region of the plasma processing chamber. A gas inlet for providing gas into the plasma processing chamber enclosure is in fluid connection with the plasma processing chamber enclosure. A gas outlet for exhausting gas from the plasma processing chamber enclosure is in fluid connection with the plasma processing chamber enclosure. At least one RF power source is electrically connected to the at least one electrode. A gas source is in fluid connection with the gas inlet.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
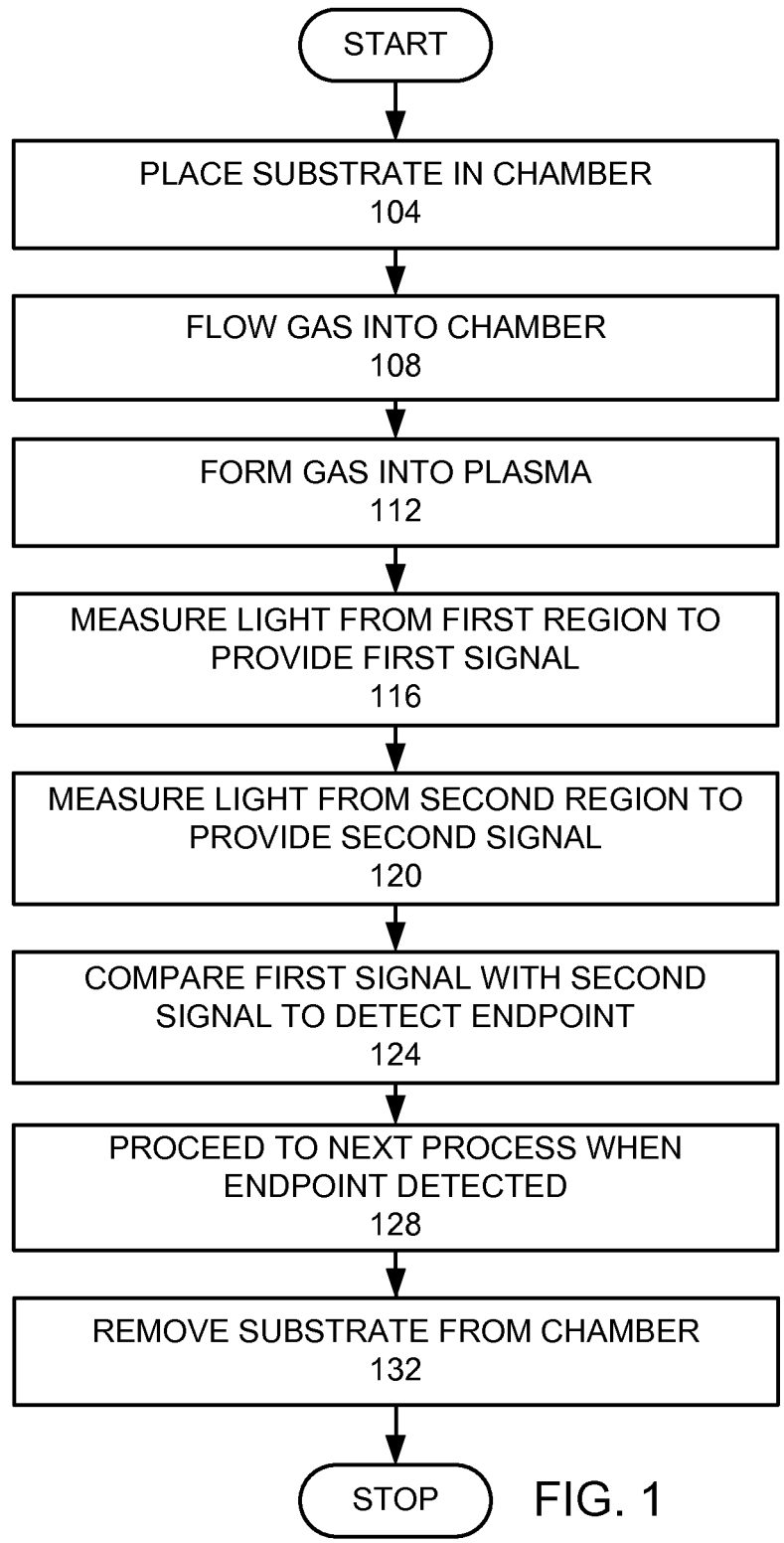
FIG. 1 is a flow chart of an embodiment of the invention.

FIG. 1 is a high level flow chart of an embodiment of the invention. In this embodiment, a substrate with an etch layer is placed in an etch chamber (step 104). A gas is flowed into the etch chamber (step 108). The gas is formed into a plasma (step 112). Light is measured from a first region of the plasma to provide a first signal (step 116). Light is measured from a second region of the plasma to provide a second signal (step 120). The first signal and second signal are compared to detect an endpoint (step 124). When the endpoint is detected, a next process step is started (step 128). The substrate is removed from the chamber (step 132).

EXAMPLE

Figure 2A:
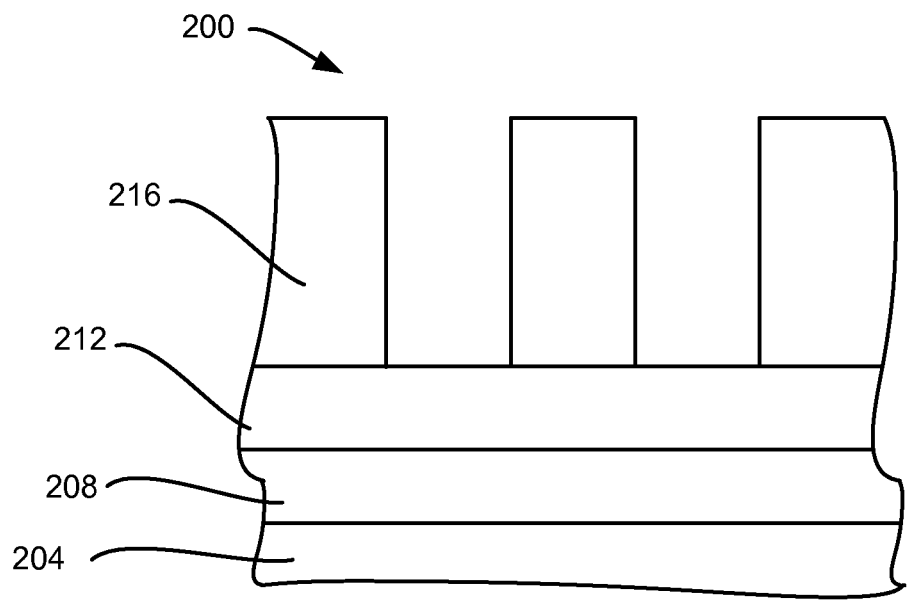
FIGS. 2A-B are schematic cross-sectional views of a stack etch according to an embodiment of the invention.

In a preferred embodiment of the invention, a substrate with an etch stop layer under an etch layer disposed under a patterned mask with features is placed in an etch chamber (step 104). FIG. 2A is a schematic cross-sectional view of a stack 200 with a substrate 204 with an etch stop layer 208 disposed below an etch layer 212, disposed below a patterned mask 216. In this example, the etch stop layer 208 is silicon nitride and the etch layer 212 is nitrogen free. So the CN from the silicon nitride and etch gases would be used as a species for endpoint detection.

Figure 3:
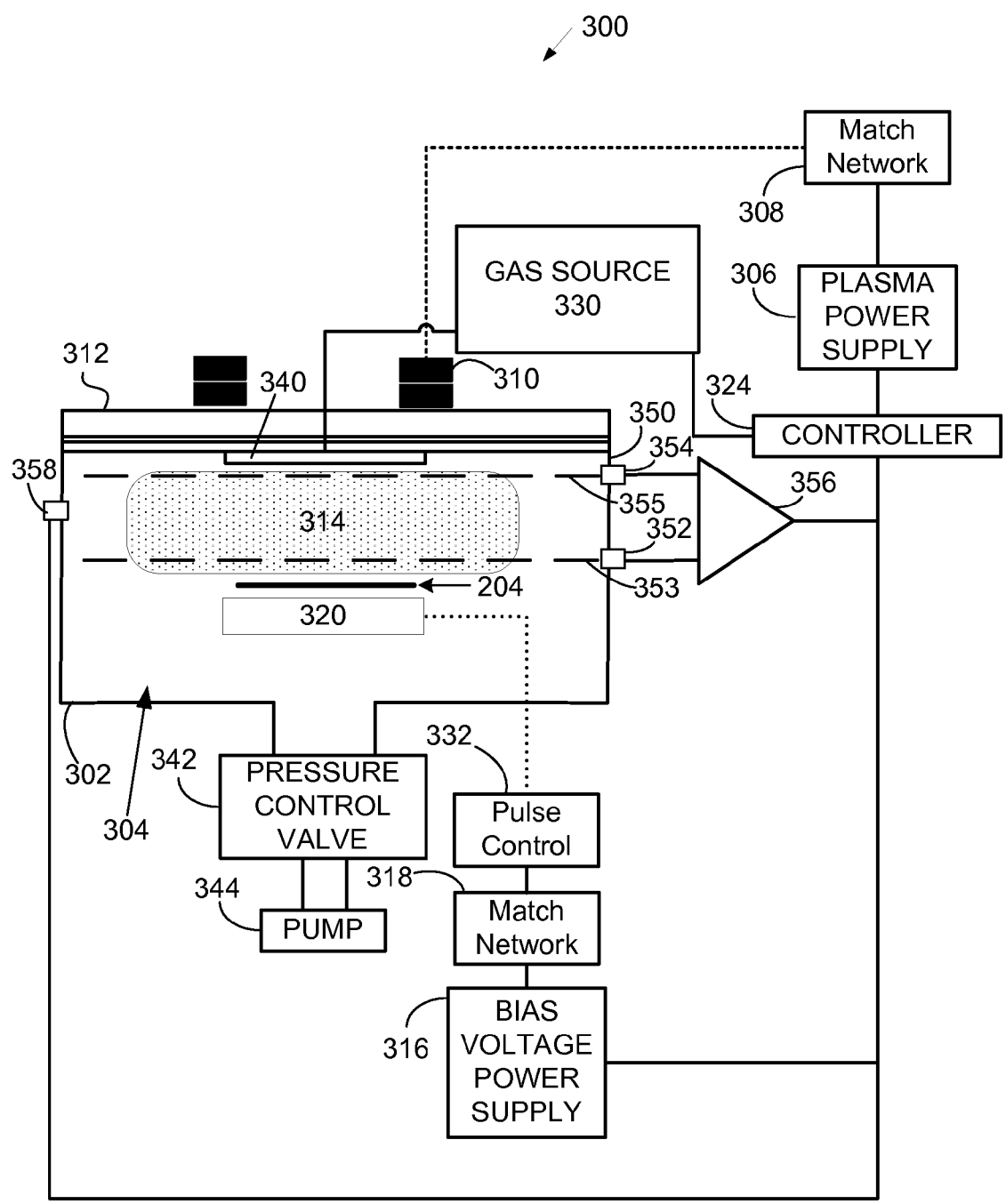
FIG. 3 is a schematic view of a plasma processing chamber that may be used in an embodiment of the invention.

FIG. 3 schematically illustrates an example of a plasma processing system 300 which may be used in one embodiment of the present invention. The plasma processing system 300 includes a plasma reactor 302 having a plasma processing chamber 304 therein defined by a chamber wall 350. A plasma power supply 306, tuned by a match network 308, supplies power to a TCP coil 310 located near a power window 312 that provides the power to the plasma processing chamber 304 to create a plasma 314 in the plasma processing chamber 304. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the silicon substrate 204, which is supported by the electrode 320, so that the electrode 320 in this embodiment is also a substrate support. A pulse controller 332 causes the bias voltage to be pulsed. The pulse controller 332 may be between the match network 318 and the substrate support, or between the bias voltage power supply 316 and the match network 318, or between the controller 324 and the bias voltage power supply 316, or in some other configuration to cause the bias voltage to be pulsed. A controller 324 sets points for the plasma power supply 306 and the wafer bias voltage supply 316. Examples of systems in which various embodiments may be used are the Kiyo™ tool and the Flex™ tool both manufactured by Lam Research Corporation of Fremont Calif.

The plasma power supply 306 and the wafer bias voltage power supply 316 may be configured to operate at specific radio frequencies such as, for example, 13.56 MHz, 60 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 50,000 Watts, and the wafer bias voltage power supply 316 may supply a bias voltage in a range of 10 to 3,000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330 in fluid connection with the plasma processing chamber 304 through a gas inlet 340. The gas inlet may be located in any advantageous location in the plasma processing chamber 304, and may take any form for injecting gas. Preferably, however, the gas inlet 340 may be configured to produce a "tunable" gas injection profile, which allows independent adjustment of the respective flow of the gases to multiple zones in the plasma processing chamber 304. The process gases and byproducts are removed from the plasma processing chamber 304 via a pressure control valve 342, which is a pressure regulator, and a pump 344, which also serves to maintain a particular pressure within the plasma processing chamber 304 and also provides a gas outlet. The gas source/gas supply mechanism 330 is controlled by the controller 324. A modified Kiyo system by Lam Research Corporation may be used to practice an embodiment of the invention.

A first light sensor 352 and a second light sensor 354 are mounted on the plasma processing chamber 304. The first light sensor 352 is positioned to measure light from a first region indicated by line 353. The second light sensor 354 is positioned to measure light from a second region indicated by line 355. The first region 353 is closer to the substrate 204 than the second region 355. Both the first region and second region are within the plasma 314. The first light sensor 352 and the second light sensor 354 provide output, which is used as input for a differential amplifier 356. The output of the differential amplifier 356 is provided to the controller 324. A light source 358 is positioned to provide light to the first light sensor 352 and the second light sensor 354 and is connected to the controller 324.

Figure 4:
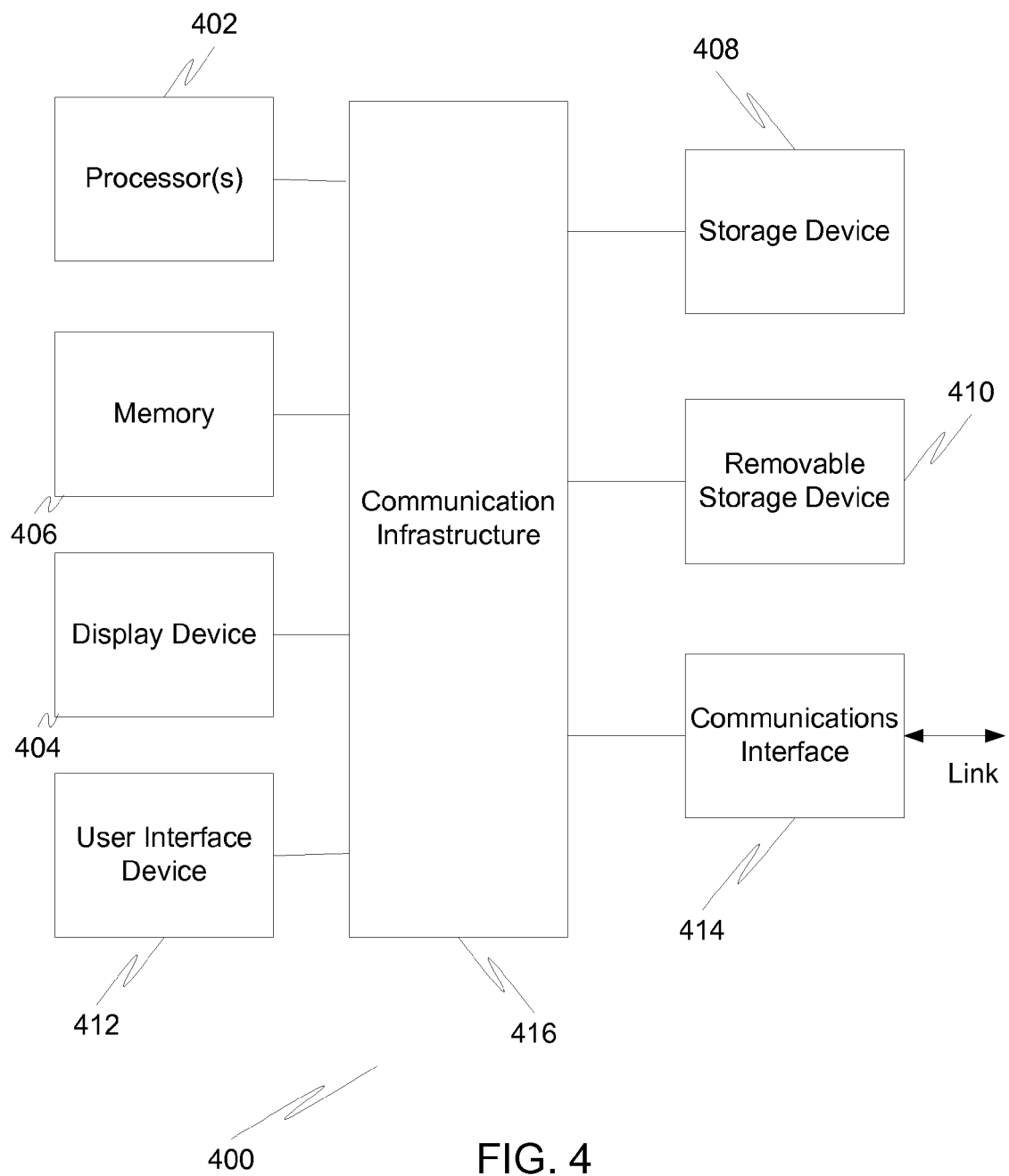
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
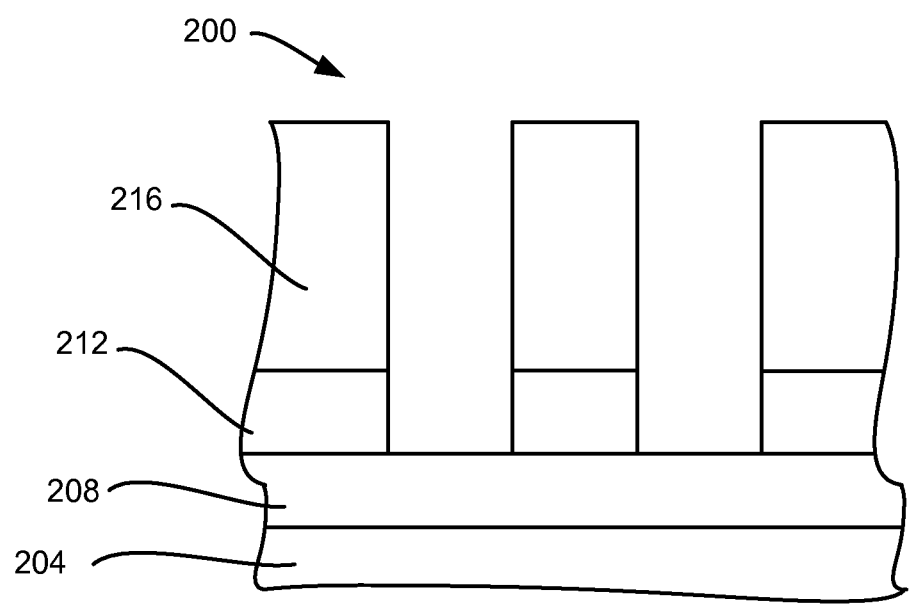

A gas is flowed from the gas source 330 into the plasma processing chamber 304 (step 108). In this example, the etch gas from the gas source 330 comprises a nitrogen containing component such as $N_2$ or $NF_3$, which provide a nitrogen species, which would mask nitrogen from the etch stop layer. The gas is formed into a plasma (step 112). The first light sensor 352 detects light from the first region 353 and generates a first signal that is provided as input to the differential amplifier 356 (step 116). The second light sensor 354 detects light from the second region 355 and generates a second signal that is provided as input to the differential amplifier 356 (step 120). In this embodiment of the invention, the first signal is normalized and the second signal is normalized to adjust the signals to the same scale The differential amplifier 356 compares the first signal with the second signal and provides the output to the controller 324 (step 124). In a steady state process the difference between the first signal and second signal may be constant. In this example, the plasma causes the etch layer 212 to be etched away, until features are etched to the etch stop 208. FIG. 2B is a schematic cross-sectional view of a stack 200 with a substrate 204 after features have been etched into the etch layer 212 to the etch stop 208.

When the etch process reaches the etch stop 208, the species in the plasma changes, because etched material from the etch stop layer are added to the plasma. The change in species occurs first in the first region 353 and then in the second region 355. Therefore, the change would be detected at the first light sensor 352 before the second light sensor 354. Such a change would cause a spike in the difference between the first signal and the second signal, which may be used as an endpoint detector. In this example, CN from the SiN etch stop layer and the etch gas increases first in the first region 353.

Since the CN from the etch gas is at steady state between the first region 353 and the second region 355, the CN from the etch gas is removed from the difference signal. Since CN from the etch stop layer and the etch gas appears in the first region 353 before the second region 355, the CN from the etch stop layer causes a spike in the difference signal providing an enhanced etch stop signal.

When the spike in the difference between the first signal and the second signal is detected, which is used as an endpoint detector, the next process is started (step 128), which may be achieved by stopping the flow of the gas, or by changing the gas. In other embodiments, the next process may be started by removing the RF power or otherwise changing the RF power or by changing another parameter. When the processing is completed, the substrate is removed from the chamber (step 132).

This embodiment of the invention provides an enhanced detection signal. Some plasma processes mask a particular species used for endpoint detection. For example, if nitrogen is the species to be detected, but nitrogen is also part of the etch chemistry, it would be difficult to detect the increase of nitrogen. However, comparing the first signal to the second signal would show a spike in nitrogen in the first region to enhance endpoint detection.

This embodiment uses the first light sensor 352 and the second light sensor 354 to detect light emitted from the plasma. By providing light from the light source 358, the first light sensor 352 and the second light sensor 354 may be used to measure light absorbed by the plasma, i.e. measuring absorption spectrum data. If light is not provided from the light source 305 then the first light sensor 352 and the second light sensor 354, may be used to measure emission spectrum data.

In another embodiment of the invention, a first spectrometer and a second spectrometer may be used to replace the differential amplifier 356. The first spectrometer may be calibrated to the second spectrometer. When a change is seen in the first spectrometer before the change is seen in the second spectrometer, the change may be used as an endpoint indicator. The spectrometer may be tuned to a specific wavelength and measure the differences in intensity for a single wavelength or a wavelength range instead of comparing the intensity for all wavelengths. In other embodiments, the spectrometer may measure intensities at different wavelengths or different ranges of wavelengths.

The differential amplifier may be separate from the controller or part of the controller. If the differential amplifier is part of the controller, the controller may be used to normalize the signals. In other embodiments the controller or other devices may be used to compare the first and second signals.

Preferably, in this embodiment, the first region and the second region do not include the substrate, etch layer, or patterned mask, as shown in FIG. 3. Instead, the sensors are directed substantially parallel to the substrate surface. More preferably, light measured by the first light sensor and second light sensor is not directly reflected from the substrate, etch layer, or patterned mask, since such light may overpower light from the plasma. However, other embodiments of the invention may provide sensors that receive some light incidentally reflected or generated from the substrate, etch layer, or mask, where the sensors are not directed directly at the substrate, etch layer, or mask. In other embodiments, the sensors may be directly directed at the substrate, etch layer, or mask.

A differential between the first signal and the second signal uses a subtraction. However, the differential between the first signal and the second signal may be directly subtracting the first raw signal from the second raw signal or subtracting a conditioned first signal from a conditioned second signal. Such conditioning may be normalizing the signals or may be a process that cleans the signals or another process. Similarly, measuring the ratio between the first signal and the second signal may create a ratio from the first raw signal and the second raw signal or may create a ratio from the first conditioned signal and the second conditioned signal.

In some embodiments proceeding to the next process may be stopping an etch process and then removing the substrate from the chamber. In other embodiments, the next process may be adding additional gases for performing a different etch process, which may be used to further etch the etch layer or to etch another layer. In other embodiments, the next process may be a deposition step, a passivation step, or a cleaning step. The detection of the endpoint provides a trigger to begin the next step. In other embodiments, a plurality of endpoints may be detected and used to end one process and begin the next.

Figure 5:
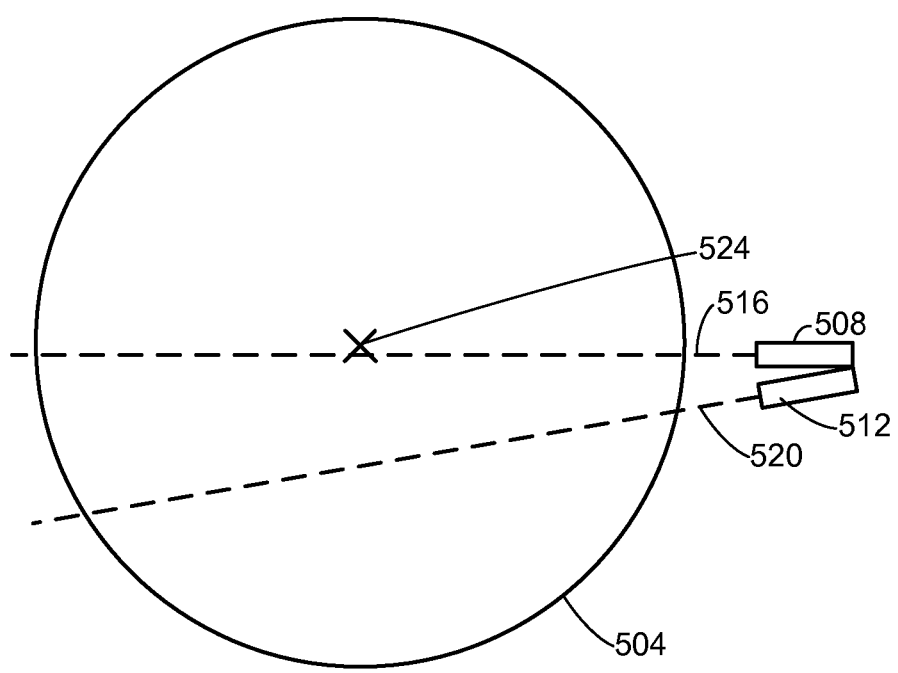
FIG. 5 is a top view of a substrate, a first light sensor, and a second light sensor used in another embodiment of the invention.

In another embodiment, the first region may be further from the center of the wafer than the second region, so that the closest part of the first region to the center of the substrate is closer to the center of the substrate than the closes part of the second region. FIG. 5 is a top view of a substrate 504, a first light sensor 508, and a second light sensor 512 used in another embodiment of the invention. The first light sensor 508 measures a first region 516. The second light sensor 512 measures a second region 520. In this embodiment, although the first and second regions 516, 520 are the same height above the substrate 504, the first region 516 passes closer to the center 524 of the substrate 504 than the second region 520. The difference or ratio of the outputs of the first light sensor 508 and second light sensor 512 may be used to detect an endpoint. This embodiment would be able to detect radial anomalies that indicate an endpoint.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching a layer, comprising:
providing a substrate in a chamber;
generating an etch plasma for etching a layer on the substrate;
measuring light from a first region of the chamber to provide a first signal;
measuring light from a second region of the chamber to provide a second signal; and
comparing the first signal with the second signal to determine an etch endpoint,
wherein the comparing the first signal with the second signal to determine an etch endpoint indicates a spike in nitrogen in the first region.

2. The method, as recited in claim 1, further comprising proceeding to a next process step after determining the etch endpoint has been reached.

3. The method, as recite in 1, wherein the first region is closer to the substrate than the second region.

4. The method, as recited in claim 1, wherein the plasma is generated within a plasma region in the chamber, and wherein the first region and second region pass into the plasma region.

5. The method, as recited in claim 1, wherein the first signal provides emission spectrum data from the first region and the second signal provides emission spectrum data from the second region.

6. The method, as recited in claim 1, further comprising providing light from a light source into the first region and the second region.

7. The method, as recited in claim 1, wherein the first signal provides absorption spectrum data from the first region and the second signal provides absorption spectrum data from the second region.

8. The method, as recited in claim 1, wherein the comparing the first signal with the second signal compares an intensity of the first signal at a wavelength with an intensity of the second signal at the wavelength.

9. The method, as recited in claim 1, wherein the comparing the first signal with the second signal compares an intensity of the first signal at a wavelength range with an intensity of the second signal at the wavelength range.

10. The method, as recited in claim 1, wherein the comparing the first signal with the second signal compares an intensity of the first signal at a first wavelength with an intensity of the second signal at a second wavelength.

11. The method, as recited in claim 1, wherein the comparing the first signal and the second signal comprises measuring a differential or ratio between the first signal and the second signal.

12. The method, as recited in claim 11, wherein the first comparing the first signal and the second signal further comprises normalizing the first signal and normalizing the second signal before measuring the differential between the first signal and the second signal.

13. An apparatus for etching an etch layer, comprising:
a plasma processing chamber, comprising:
  a chamber wall forming a plasma processing chamber enclosure;
  a substrate support for supporting a wafer within the plasma processing chamber enclosure;
  a pressure regulator for regulating the pressure in the plasma processing chamber enclosure;
  at least one electrode for providing power to the plasma processing chamber enclosure for sustaining a plasma;
  a first light sensor for detecting light from a first region of the plasma processing chamber;
  a second light sensor for detecting light from a second region of the plasma processing chamber;
  a gas inlet for providing gas into the plasma processing chamber enclosure;
  a gas outlet for exhausting gas from the plasma processing chamber enclosure;
at least one RF power source electrically connected to the at least one electrode;
a gas source in fluid connection with the gas inlet;
at least one processor; and
computer readable media, comprising:
  computer readable code for flowing an etch gas from the gas source into the plasma processing chamber;
  computer readable code for forming a plasma from the etch gas;
  computer readable code for comparing a first signal from the first light sensor with a second signal from the second light sensor to determine when an etch stop has been reached, wherein the comparing the first signal with the second signal to determine an etch endpoint indicates a spike in nitrogen in the first region or wherein the comparison of the first signal and the second signal indicates that CN from a SiN etch stop layer is present in the first region; and
  computer readable code for going to a next process after determining that an etch stop has been reached.

14. The apparatus, as recited in claim 13, wherein the plasma processing chamber further comprises a light source positioned to provide light to the first light sensor and the second light sensor.

15. The apparatus, as recited in claim 13, wherein the first region is closer to the substrate support than the second region.

16. The apparatus, as recited in claim 13, wherein the first region and the second region do not include the substrate support.

17. A method for etching a layer, comprising:
providing a substrate in a chamber;
generating an etch plasma for etching a layer on the substrate;
measuring light from a first region of the chamber to provide a first signal;
measuring light from a second region of the chamber to provide a second signal; and
comparing the first signal with the second signal to determine an etch endpoint,
wherein the comparison of light measured from a first region of the chamber to provide a first signal and light measured from a second region of the chamber to provide a second signal indicates that CN from a SiN etch stop layer is present in the first region.

18. The method, as recited in claim 17, wherein the comparing the first signal and the second signal comprises measuring a differential or ratio between the first signal and the second signal.

19. The method, as recited in claim 17, wherein the first comparing the first signal and the second signal further comprises normalizing the first signal and normalizing the second signal before measuring the differential between the first signal and the second signal.

20. The method, as recite in 17, wherein the first region is closer to the substrate than the second region.

* * * * *